United States Patent
Yanagita et al.

(10) Patent No.: US 7,017,830 B2
(45) Date of Patent: Mar. 28, 2006

(54) METHOD AND APPARATUS FOR SEPARATING SAMPLE

(75) Inventors: Kazutaka Yanagita, Kanagawa (JP); Kiyofumi Sakaguchi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 326 days.

(21) Appl. No.: 10/644,032

(22) Filed: Aug. 20, 2003

(65) Prior Publication Data

US 2004/0058537 A1  Mar. 25, 2004

Related U.S. Application Data

(62) Division of application No. 09/930,137, filed on Aug. 16, 2001, now Pat. No. 6,712,288.

(30) Foreign Application Priority Data

Aug. 25, 2000 (JP) ............... 2000-256136

(51) Int. Cl.
*B05B 1/08* (2006.01)
*F02M 45/10* (2006.01)

(52) U.S. Cl. ............ 239/101; 239/93; 239/95; 239/140; 239/99

(58) Field of Classification Search ........... 239/101, 239/93, 95, 140, 99, 225.1, 232, 237, 247; 438/406, 409, 413, 714, 719

See application file for complete search history.

(56) References Cited

U.S. PATENT DOCUMENTS

| | | | | |
|---|---|---|---|---|
| 3,994,809 A * | 11/1976 | Rhodes | ............ | 210/748 |
| 5,360,748 A | 11/1994 | Nadahara et al. | ............ | 437/11 |
| 5,371,037 A | 12/1994 | Yonehara | ............ | 437/86 |
| 5,458,755 A | 10/1995 | Fujiyama et al. | ............ | 204/224 R |
| 5,811,348 A | 9/1998 | Matsushita et al. | ............ | 438/455 |
| 5,856,229 A | 1/1999 | Sakuguchi et al. | ............ | 483/406 |
| 5,863,830 A | 1/1999 | Bruel et al. | ............ | 438/478 |
| 6,107,213 A | 8/2000 | Tayanaka | ............ | 438/762 |
| 6,186,193 B1 | 2/2001 | Phallen et al. | ............ | 141/83 |
| 6,313,014 B1 | 11/2001 | Sakaguchi et al. | ............ | 438/475 |
| 6,350,703 B1 | 2/2002 | Sakaguchi et al. | ............ | 438/766 |
| 6,382,292 B1 | 5/2002 | Ohmi et al. | ............ | 156/584 |
| 6,391,743 B1 | 5/2002 | Iwane et al. | ............ | 438/458 |
| 6,418,999 B1 | 7/2002 | Yanagita et al. | ............ | 156/584 |
| 6,427,747 B1 | 8/2002 | Omi et al. | ............ | 156/584 |
| 6,427,748 B1 | 8/2002 | Yanagita et al. | ............ | 156/584 |
| 6,436,226 B1 | 8/2002 | Omi et al. | ............ | 156/344 |

(Continued)

FOREIGN PATENT DOCUMENTS

EP   0 867 917   9/1998

(Continued)

OTHER PUBLICATIONS

R.P. Holmstrom et al., "Complete dielectric isolation by highly selective and self-stopping formation of oxidized porous silicon", Appl. Phys. Lett 42(4), pp. 386-388, Feb. 15, 1983.

(Continued)

*Primary Examiner*—Davis Hwu
(74) *Attorney, Agent, or Firm*—Fitzpatrick, Cella, Harper & Scinto

(57) ABSTRACT

This invention is to improve the reproducibility and yield in separating a bonded substrate stack. A bonded substrate stack having a porous layer inside is held by substrate holding portions 105 and 106, and a fluid is injected from a nozzle to the porous layer of the bonded substrate stack, thereby separating the bonded substrate stack at the porous layer. The variation in pressure of the fluid is suppressed within a predetermined range by a servo-driven pump.

24 Claims, 13 Drawing Sheets

U.S. PATENT DOCUMENTS

| | | | |
|---|---|---|---|
| 6,448,155 B1 | 9/2002 | Iwasaki et al. | 438/464 |
| 6,468,923 B1 | 10/2002 | Yonehara et al. | 438/761 |
| 6,475,460 B1 * | 11/2002 | Max | 423/437.1 |
| 6,497,794 B1 * | 12/2002 | Max | 203/10 |
| 2001/0038153 A1 | 11/2001 | Sakaguchi et al. | |
| 2002/0045237 A1 | 4/2002 | Yanagita et al. | |

FOREIGN PATENT DOCUMENTS

| | | |
|---|---|---|
| JP | 5-21338 | 1/1993 |
| JP | 7-302889 | 11/1995 |
| JP | 11-005064 | 1/1999 |
| JP | 11-45840 | 2/1999 |
| WO | WO 98/52216 | 11/1998 |

OTHER PUBLICATIONS

A. Uhlir, Jr., "Electrolytic Shaping of Germanium and Silicon", The Bell System Technical Journal, vol. XXXV 1956, pp. 333-347.

K. Nagano et al., "Oxidized Porous Silicon and It's Application", IEICE, vol. 79, pp. 49-54, SSD79-9549, 1979.

T. Unagami, "Formation Mechanism of Porous Silicon Layer by Anodization in HF Solution", Journal of the Electrochemical Society, vol. 127, No. 2, pp. 476-483, Feb. 1980.

* cited by examiner

METHOD AND APPARATUS FOR SEPARATING SAMPLE

FIELD OF THE INVENTION

The present invention relates to a method and apparatus for separating a sample such as a bonded substrate stack, a transfer film transfer method, a substrate manufacturing method, and a semiconductor device and a method of manufacturing the same.

BACKGROUND OF THE INVENTION

A substrate (SOI substrate) having an SOI (Silicon On Insulator) structure is known as a substrate having a single-crystal Si layer on an insulating layer. A device using this SOI substrate has many advantages that cannot be achieved by ordinary Si substrates. Examples of the advantages are as follows.
(1) The integration degree can be increased because dielectric isolation is easy.
(2) The radiation resistance can be increased.
(3) The operating speed of the device can be increased because the stray capacitance is small.
(4) No well step is necessary.
(5) Latch-up can be prevented.
(6) A complete depletion type field effect transistor can be formed by thin film formation.

Since an SOI structure has the above various advantages, researches have been made on its formation method for several decades.

As a method, an SOI structure is formed by bonding a single-crystal Si substrate to another thermally oxidized single-crystal Si substrate by annealing or an adhesive. In this method, an active layer for forming a device must be uniformly thin. More specifically, a single-crystal Si substrate having a thickness of several hundred micron must be thinned down to the micron order or less.

To thin the substrate, polishing or selective etching can be used.

A single-crystal Si substrate can hardly be uniformly thinned by polishing. Especially, in thinning to the submicron order, the variation range is several ten %. As the wafer size becomes large, this difficulty becomes more pronounced.

Selective etching is effective to uniformly thin the substrate. However, the selectivity ratio is as low as about $10^2$, the surface planarity after etching is poor, and the crystallinity of the SOI layer is unsatisfactory.

The present applicant has disclosed a new SOI technique in Japanese Patent Laid-Open No. 5-021338. In this technique, a first substrate obtained by forming a porous layer on a single-crystal Si substrate and a non-porous single-crystal layer on its surface is bonded to a second substrate via an insulating layer. After this, the bonded substrate stack is separated into two substrates at the porous layer, thereby transferring the non-porous single-crystal layer to the second substrate. This technique is advantageous because the film thickness uniformity of the SOI layer is good, the crystal defect density in the SOI layer can be decreased, the surface planarity of the SOI layer is good, no expensive manufacturing apparatus with special specifications is required, and SOI substrates having about several hundred-Å to 10-μm thick SOI films can be manufactured by a single manufacturing apparatus.

The present applicant has also disclosed, in Japanese Patent Laid-Open No. 7-302889, a technique of bonding first and second substrates, separating the first substrate from the second substrate without breaking the first substrate, smoothing the surface of the separated first substrate, forming a porous layer again, and reusing the substrate. Since the first substrate is not wasted, this technique is advantageous in largely reducing the manufacturing cost and simplifying the manufacturing process.

To separate the bonded substrate stack into two substrates without breaking the first and second substrates, the following methods are available: the two substrates are pulled in opposite directions while applying a force in a direction perpendicular to the bonding interface; a shearing force is applied parallel to the bonding interface (for example, the two substrates are moved in opposite directions in a plane parallel to the bonding interface, or the two substrates are rotated in opposite directions while applying a force in the circumferential direction); pressure is applied in a direction perpendicular to the bonding interface; a wave energy such as an ultrasonic wave is applied to the separation region; a peeling member (e.g., a sharp blade such as a knife) is inserted into the separation region parallel to the bonding interface from the side surface side of the bonded substrate stack; the expansion energy of a substance filling the pores of the porous layer functioning as the separation region is used; the porous layer functioning as the separation region is thermally oxidized from the side surface of the bonded substrate stack to expand the volume of the porous layer and separate the substrates; and the porous layer functioning as the separation region is selectively etched from the side surface of the bonded substrate stack to separate the substrates.

Porous Si was found in 1956 by Uhlir et al. who were studying electropolishing of semiconductors ("Electrolytic Shaping of Germanium and Silicon", A. Uhlir, Bell System Technical Journal Vol.35, pp. 333–347, March, 1956).

Porous Si can be formed by anodizing an Si substrate in an HF solution.

Unagami et al. studied the dissolution reaction of Si upon anodizing and reported that holes were necessary for anodizing reaction of Si in an HF solution, and the reaction was as follows ("Formation Mechanism of Porous Silicon Layer by anodization in HF Solution" T. Unagami, Journal of the Electrochemical Society, Vol. 127, pp. 476–483, 1980T. Unagami).

$$Si + 2HF + (2-n)e^+ \rightarrow SiF_2 + 2H^+ + ne^-$$

$$SiF_2 + 2HF \rightarrow SiF_4 + H_2$$

$$SiF_4 + 2HF \rightarrow H_2SiF_6$$

or $$Si + 4HF + (4-\lambda)e^+ \rightarrow SiF_4 + 4H^+ + \lambda e^-$$

$$SiF_4 + 2HF \rightarrow H_2SiF_6$$

where $e^+$ and $e^-$ represent a hole and an electron, respectively, and n and λ are the number of holes necessary to dissolve one Si atom. According to them, when n>2 or λ>4, porous Si is formed.

The above fact suggests that p-type Si having holes is converted into porous Si while n-type Si is not converted. The selectivity in this conversion has been reported by Nagano et al. and Imai ("Oxidized Porous Silicon and It's Application" K. Nagano et al., (The transactions of the institute of electronics and communication engineers), The Institute of Electronics, Information and Communication Engineers, Vol. 79, pp 49–54, SSD79-9549, 1979), ("A New Dielectric Isolation Method Using Porous Silicon" K. IMAI, Solid-State Electronics, Vol. 24, pp. 159–164, 1981).

However, it has also been reported that n-type at a high concentration is converted into porous Si ("Complete dielectric isolation by highly selective and self-stopping formation of oxidized porous silicon" R. P. Holmstrom and J. Y. Chi, Applied Physics Letters, Vol. 42, pp. 386–388, 1983). Hence, it is important to select a substrate which can be converted into a porous Si substrate independently of p- or n-type.

To form a porous layer, instead of the above anodizing method, for example, a method of implanting ions into a silicon substrate may also be used.

For example, in the method described in Japanese Patent Laid-Open No. 5-021338, i.e., the method of preparing a substrate (to be referred to as a bonded substrate stack hereinafter) by bonding a first substrate having a non-porous layer such as a single-crystal Si layer on a porous layer to a second substrate via an insulating layer, and separating the bonded substrate stack at the porous layer so as to transfer the non-porous layer formed on the first substrate side to the second substrate, the technique of separating the bonded substrate stack at high reproducibility and high yield is very important.

SUMMARY OF THE INVENTION

The present invention has been made in consideration of the above situation, and has as its object to improve the reproducibility and yield in separating, e.g., a sample or composite member such as a bonded substrate stack.

According to the first aspect of the present invention, there is provided a separating apparatus for separating a sample by a fluid, characterized by comprising a holding portion for holding a sample having a separation layer inside, a nozzle for injecting a fluid to the separation layer of the sample held by the holding portion, a fluid supply portion for supplying the fluid to the nozzle, wherein the fluid supply portion suppresses a variation in pressure of the fluid to be supplied to the nozzle within a predetermined range during separation processing so that the fluid is ejected from said nozzle at substantially constant pressure.

The fluid supply portion preferably suppresses the variation in pressure of the fluid to be supplied to the nozzle within ±10% of a target pressure during the separation processing.

The fluid supply portion preferably comprises a servo-driven pump and supplies the fluid to the nozzle from the servo-driven pump.

The separating apparatus according to the first aspect of the present invention preferably further comprises a rotational drive portion for rotating the sample about an axis perpendicular to the separation layer by rotating the holding portion.

The separating apparatus according to the first aspect of the present invention preferably further comprises an operation mechanism for changing a position where the fluid is injected from the nozzle to the sample along with progress of the separation processing. The operation mechanism preferably changes the position where the fluid is injected to the separation layer of the sample gradually or stepwise from a peripheral portion to a central portion of the separation layer along with progress of the separation processing.

The sample preferably has, outside the separation layer, a concave portion recessed from a side surface.

The separation layer is preferably a fragile layer, e.g., a layer formed by anodization or ion implantation.

According to the second aspect of the present invention, there is provided a separating method of separating a sample by a fluid, characterized in that a sample having a separation layer inside is separated at the separation layer while injecting a fluid whose variation in pressure is suppressed within a predetermined range to the separation layer of the sample.

According to the third aspect of the present invention, there is provided a transfer method of transferring a transfer layer on a surface of a first member to a second member, characterized by comprising the preparation step of preparing a composite member by bringing the first member having a separation layer inside and the transfer layer on the separation layer into tight contact with the second member, and the step of separating the composite member at the separation layer while injecting a fluid, maintained at substantially constant pressure by suppressing variation in pressure within a predetermined range, to the separation layer of the composite member, thereby transferring the transfer layer of the first member to the second member.

According to the fourth aspect of the present invention, there is provided a substrate manufacturing method characterized by comprising the preparation step of preparing a bonded substrate stack by bonding a first substrate having a separation layer inside and a transfer layer on the separation layer to a second substrate, and the separation step of separating the bonded substrate stack at the separation layer while injecting a fluid, maintained at substantially constant pressure by suppressing variation in the pressure within a predetermined range, to the separation layer of the bonded substrate stack.

The predetermined range is preferably ±10% of a target pressure.

In the separation step, preferably, the pressure of the fluid is servo-controlled.

In the separation step, preferably, the bonded substrate stack is separated while being rotated about an axis perpendicular to the separation layer.

In the separation step, preferably, the bonded substrate stack is separated while changing a position where the fluid is injected to the bonded substrate stack along with progress of separation processing. In the separation step, more preferably, the bonded substrate stack is separated while changing the position where the fluid is injected to the separation layer of the bonded substrate stack gradually or stepwise from a peripheral portion to a central portion of the separation layer along with progress of the separation processing.

The separation layer is preferably a fragile layer, e.g., a layer formed by anodization or ion implantation.

The transfer layer preferably includes a single-crystal Si layer, and more preferably, in addition to the single-crystal Si layer, an insulating layer on the single-crystal Si layer.

According to the fifth aspect of the present invention, there is provided a semiconductor device manufacturing method characterized by comprising the steps of preparing an SOI substrate using the substrate manufacturing method according to the fourth aspect of the present invention, and element-isolating an SOI layer of the SOI substrate and forming a transistor on the element-isolated SOI layer.

The transistor may be either a partial depletion type FET or a complete depletion type FET.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will be described below with reference to the accompanying drawings.

FIGS. 1A to 1E are schematic views for explaining a method of manufacturing a substrate having, e.g., an SOI structure according to a preferred embodiment of the present invention.

Figure 1A:
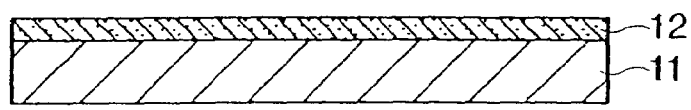
FIGS. 1A to 1E are schematic views for explaining the step of forming a porous layer in a substrate manufacturing method according to a preferred embodiment of the present invention.

In the step shown in FIG. 1A, a single-crystal Si substrate 11 to be used to form a first substrate (seed wafer) 10 is prepared, and a porous Si layer 12 serving as a separation layer is formed on the major surface of the single-crystal Si substrate 11. The porous Si layer 12 can be formed by, e.g., anodizing the single-crystal Si substrate 11 in an electrolyte solution (anodizing solution).

As the electrolyte solution, for example, a solution containing hydrogen fluoride, a solution containing hydrogen fluoride and ethanol, a solution containing hydrogen fluoride and isopropyl alcohol, or the like can be used. More specifically, as the electrolyte solution, for example, a solution mixture containing an HF aqueous solution (HF concentration=49 wt %) and ethanol at a volume ratio of 2:1 can be used.

The porous Si layer 12 may have a multilayered structure including two or more layers with different porosities. The porous Si layer 12 having a multilayered structure preferably includes the first porous Si layer with the first porosity on the surface side, and, under the first porous Si layer, the second porous Si layer with the second porosity higher than the first porosity. With such a multilayered structure, a non-porous layer 13 free from defects can be formed on the first porous Si layer in the step of forming the non-porous layer 13 later, and a bonded substrate stack can be separated at a desired position in the separation step layer. The first porosity is preferably 10% to 30% and, more preferably, 15% to 25%. The second porosity is preferably 35% to 70% and, more preferably, 40% to 60%.

When the above solution mixture (49 wt % hydrofluoric acid: ethanol=2:1) is used as the electrolyte solution, preferably, for example, the first layer (surface side) is formed at a current density of 8 mA/cm$^2$ for a process time of 5 to 11 min, and the second layer (inner surface side) is formed at a current density of 23 to 33 mA/cm$^2$ for a process time of 80 sec to 2 min.

Next, at least one of the following steps (1) to (4) is preferably executed. The steps (1) and (2) are preferably executed in this order. More preferably, the steps (1), (2), and (3), or (1), (2), and (4) are executed in this order. Most preferably, the steps (1), (2), (3), and (4) are executed in this order.

(1) Step of Forming Protective Film on Porous Walls in Porous Si Layer (Pre-oxidation Step)

In this step, a protective film such as an oxide film or nitride film is formed on the porous walls in the porous Si layer 12, thereby preventing any increase in porous size by later annealing. The protective film can be formed by performing annealing in an oxygen atmosphere (preferably at, e.g., 200° C. to 700° C., and more preferably at 300° C. to 500° C.). After that, the oxide film or the like formed on the surface of the porous Si layer 12 is preferably removed.

This can be done by, e.g., exposing the surface of the porous Si layer 12 to a solution containing hydrofluoric acid.

(2) Hydrogen Baking Step (Pre-baking Step)

In this step, the first substrate 10 on which the porous Si layer 12 is formed is annealed in a reduction atmosphere containing hydrogen at 800° C. to 1,200° C. With this annealing, pores on the surface of the porous Si layer 12 can be sealed to some extent. If a native oxide film is present on the surface of the porous Si layer 12, it can be removed.

(3) Trace Material Supply Step (Pre-injection Step)

When the non-porous layer 13 is to be grown on the porous Si layer 12, the non-porous layer 13 is preferably grown at a low speed by supplying a trace of raw material substance of the non-porous layer 13 at the initial stage of growth. With this growing method, atomic migration on the surface of the porous Si layer 12 is promoted, and pores on the surface of the porous Si layer 12 can be sealed. More specifically, the supply of the raw material is controlled such that the growth rate becomes 20 nm/min or less, preferably 10 nm/min or less, and more preferably, 2 nm/min or less.

(4) High-temperature Baking Step (Intermediate Baking Step)

When annealing is executed in a reduction atmosphere containing hydrogen at a temperature higher than that in the above hydrogen baking step and/or trace material supply step, further sealing and flattening of the porous Si layer 12 can be realized.

Figure 1B:
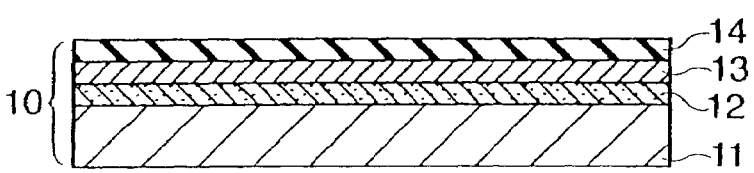

At the first stage of the step shown in FIG. 1B, the first non-porous layer 13 is formed on the porous Si layer 12. As the first non-porous layer 13, an Si layer such as a single-crystal Si layer, poly-Si layer, or amorphous Si layer, Ge layer, SiGe layer, SiC layer, C layer, GaAs layer, GaN layer, AlGaAs layer, InGaAs layer, InP layer, or InAs layer can be used. It should be understood that a plurality of layers such as SiGe and Si layers can be formed as the first non-porous layer 13.

At the second stage of the step shown in FIG. 1B, an $SiO_2$ layer (insulating layer) 14 as the second non-porous layer is formed on the first non-porous layer 13. With this process, the first substrate 10 is obtained. The $SiO_2$ layer 14 can be formed, e.g., in an $O_2/H_2$ atmosphere at 1,100° C. for 10 to 33 min.

Figure 1C:
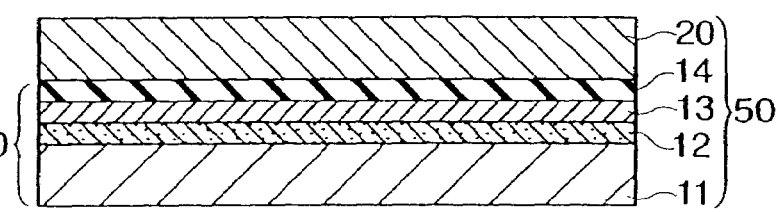

In the step shown in FIG. 1C, a second substrate (handle wafer) 20 is prepared and brought into tight contact with the first substrate 10 at room temperature while making the insulating layer 14 face the second substrate 20, thereby forming a bonded substrate stack 30.

The $SiO_2$ layer 14 can be formed either on the single-crystal Si layer 13 side, or on the second substrate 20, or on both the single-crystal Si layer 13 and the second substrate 20 as long as the state shown in FIG. 1C is obtained when the first and second substrates are brought into tight contact with each other. However, when the insulating layer 14 is formed on the first non-porous layer (e.g., a single-crystal Si layer) 13 side serving as an active layer, as described above, the bonding interface between the first substrate 10 and the second substrate 20 can be separated from the active layer, and a semiconductor substrate such as an SOI substrate with a higher quality can be obtained. Note that the insulating layer 14 may be omitted.

After the substrates 10 and 20 are completely brought into tight contact, processing of strengthening bonding between the substrates is preferably executed. As an example of this processing, processing of, e.g., 1) executing annealing in an $N_2$ atmosphere at 1,100° C. for 10 min and 2) executing annealing (oxidation) in an $O_2/H_2$ atmosphere at 1,100° C. for 50 to 100 min is preferably performed. In addition to this processing, or in place of this processing, anodic bonding and/or compression may be executed.

As the second substrate 20, an Si substrate, a substrate obtained by forming an $SiO_2$ layer on an Si substrate, a transparent substrate formed from quartz or the like, or a sapphire substrate can be used. However, a substrate of another type which has a sufficiently flat surface to be bonded may be used as the second substrate 20.

Figure 1D:
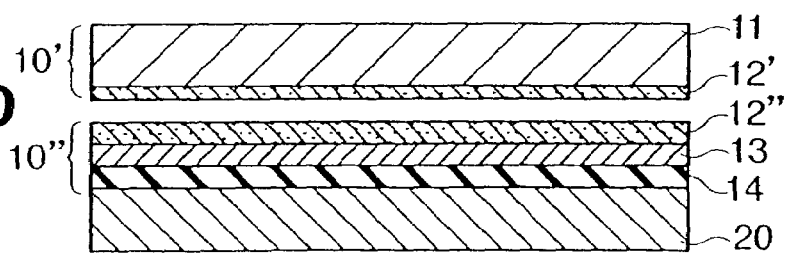

In the step shown in FIG. 1D, the bonded substrate stack 30 is separated at the fragile porous layer 12 with a low mechanical strength using a separating method to be described later.

Figure 1E:
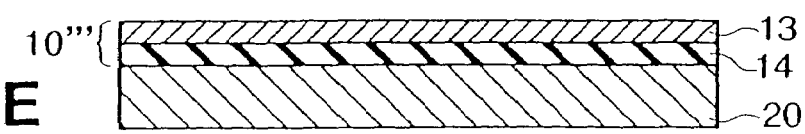

In the step shown in FIG. 1E, a porous layer 12b on the single-crystal Si substrate 11 on a separated first substrate 10' is selectively removed by etching or the like. The single-crystal Si substrate 11 obtained in this way can be reused as a substrate for forming the first substrate 10 or as the second substrate 20.

As a bonded substrate stack, a substrate prepared by the following method may be employed. First, a semiconductor substrate represented by a single-crystal Si substrate such as a mirror wafer or epitaxial wafer is prepared. An insulating film such as a thermal silicon oxide film is formed on the surface of the substrate, as needed. Next, ions such as hydrogen ions or rare gas ions are implanted into the substrate by ion implantation using a line beam or plasma immersion, thereby forming a relatively heavily doped ion implantation layer serving as a separation layer at a predetermined depth from the surface. The first substrate is obtained in the above manner.

Next, the second substrate is prepared according to the same procedure as described above and bonded to the first substrate in accordance with the above-described bonding method. With this process, a bonded substrate stack having a layer to be transferred (transfer layer) inside can be obtained.

The ion implantation layer is distorted or contains defects or pores formed from microcavities due to the implanted ions. Such an ion implantation layer has a relatively low mechanical strength and therefore functions as a separation layer.

A separating method and apparatus according to a preferred embodiment of the present invention, which can be applied to the separation step shown in FIG. 1D, will be described next. As a characteristic feature of the preferred embodiment of the present invention, in a separating method and apparatus for ejecting a fluid (a liquid such as a water or a gas such as a nitrogen gas, an argon gas, or air) toward the separation layer of a sample or composite member such as a bonded substrate stack so as to separate the sample or composite member into two substrates at the separation layer, the sample or composite member is separated at the separation layer while suppressing a variation in pressure of the fluid within a predetermined range so that the fluid maintained at substantially constant pressure is ejected from a nozzle. By this method, yield in the separating process can be improved. It is preferable that the pressure control is continued until the sample or composite member is completely separated after the separating process starts. The variation in pressure preferably falls within 10% of the target pressure. The sample or composite member such as a bonded substrate stack preferably has, outside the separation layer, a concave portion which is recessed from the side surface. The concave portion can be formed either along the periphery of the separation layer or only at a position outside the separation layer.

The method of separating a composite member such as a bonded substrate stack is disclosed in Japanese Patent No. 2,877,800 to Canon.

Figure 4:
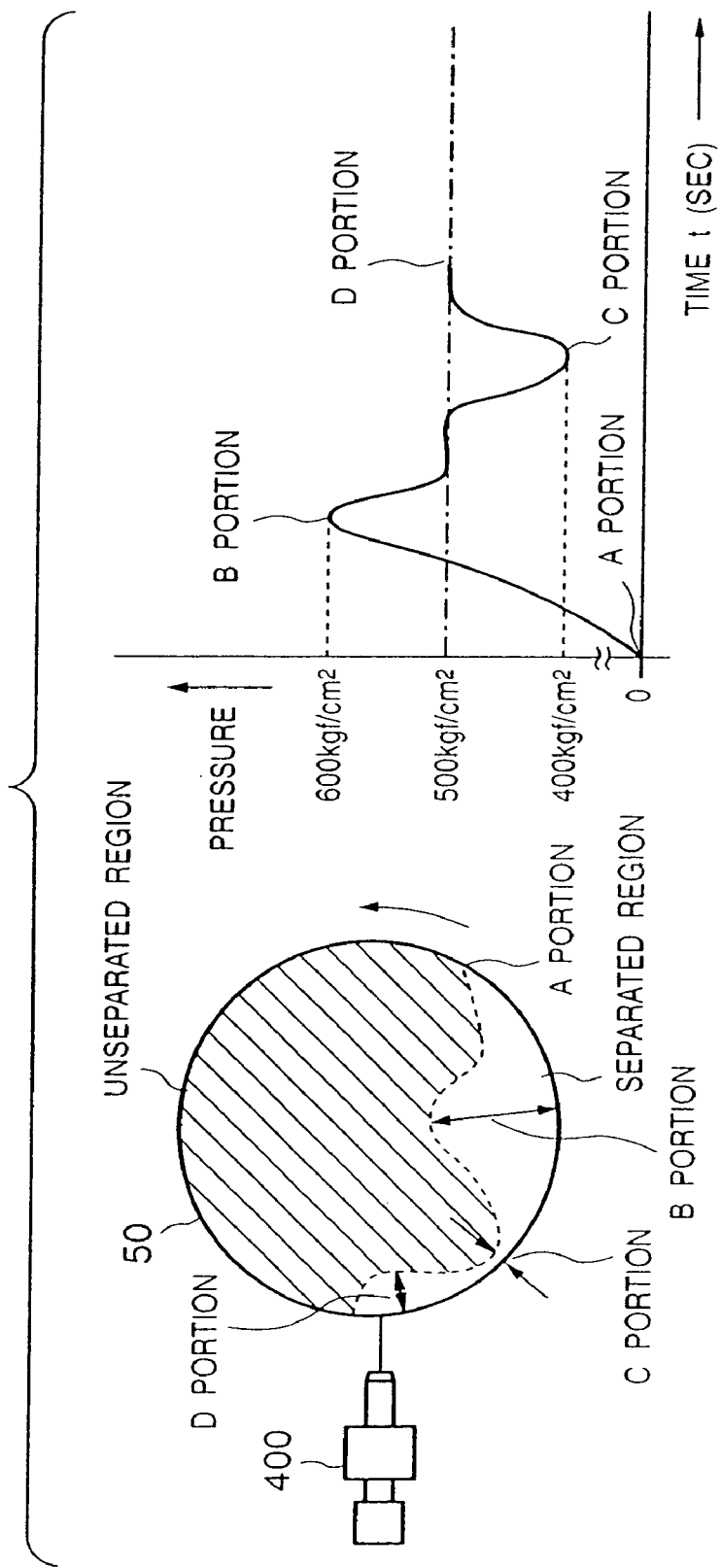
FIG. 4 shows a plan view and graph showing a state (initial stage) wherein a bonded substrate stack is separated by a so-called water jet apparatus using water as a fluid while rotating the bonded substrate stack.
Figure 5:
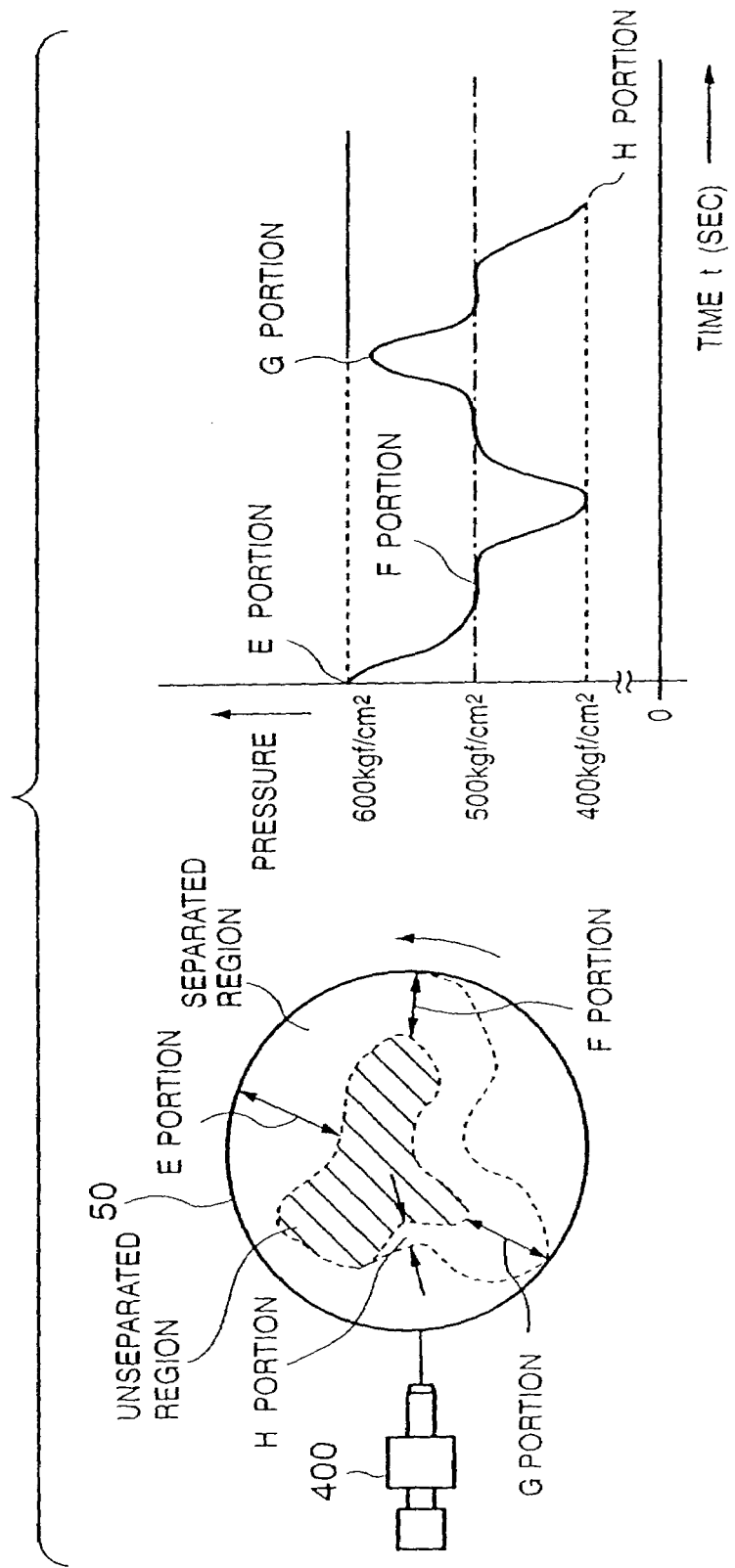
FIG. 5 shows a plan view and graph showing a state (intermediate stage) wherein the bonded substrate stack is separated by the so-called water jet apparatus using water as the fluid while rotating the bonded substrate stack.
Figure 6:
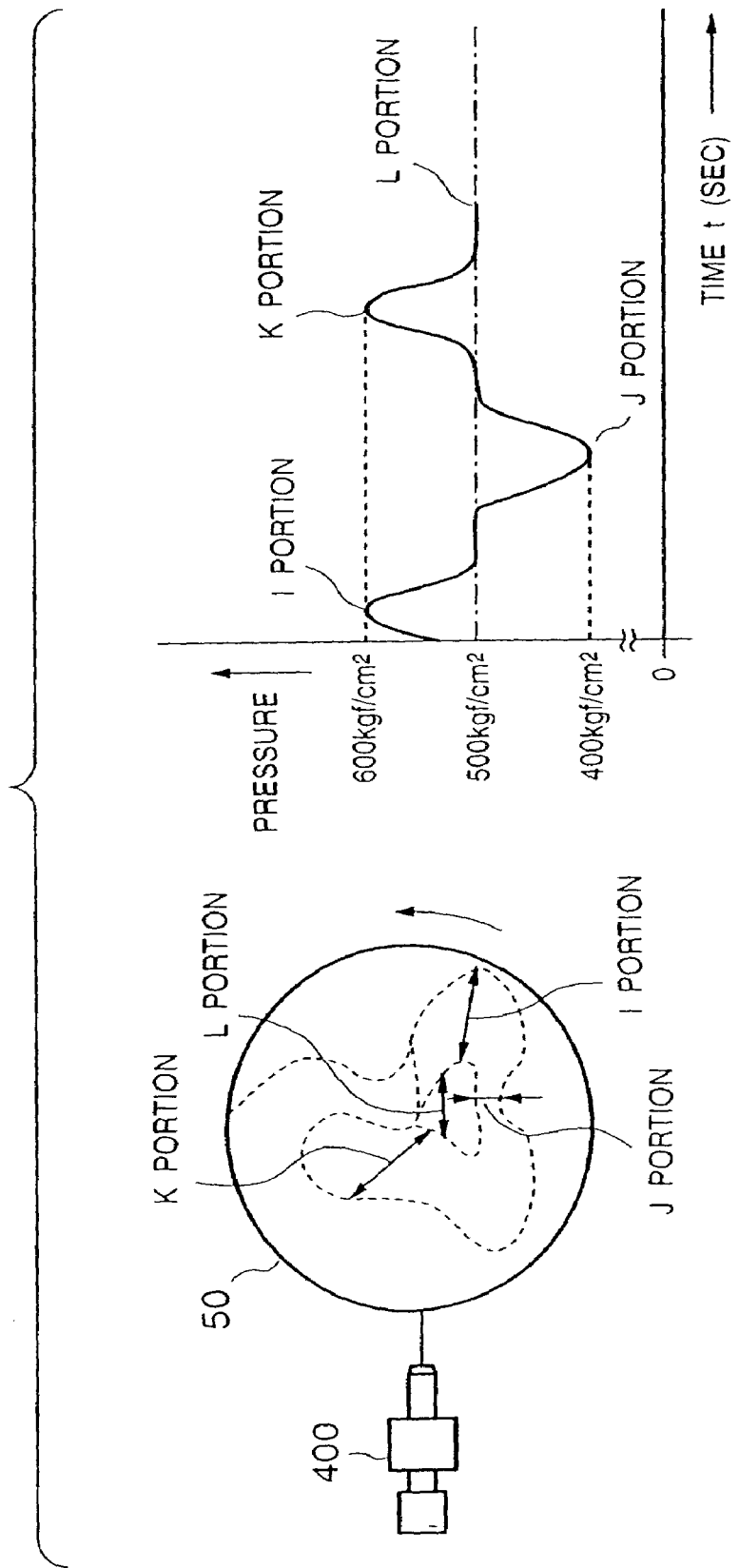
FIG. 6 shows a plan view and graph showing a state (final stage) wherein the bonded substrate stack is separated by the so-called water jet apparatus using water as the fluid while rotating the bonded substrate stack.

To help understanding the present invention, a problem that may occur when the variation in pressure of the fluid is large will be described with reference to FIGS. 4 to 6. FIGS. 4 to 6 show a state wherein a bonded substrate stack is separated by a so-called water jet apparatus using water as a fluid while rotating the bonded substrate stack. FIG. 4 schematically shows the initial stage of separation processing. FIG. 5 schematically shows the intermediate stage of separation processing. FIG. 6 schematically shows the final stage of separation processing. Referring to FIGS. 4 to 6, a "separated region" is an already separated region, an "unseparated region" is a region that has not been separated yet, and a "pressure" is the pressure of a fluid (jet pressure). In this example, the variation in pressure of the fluid falls within the range of ±20% of the target pressure.

When the variation in pressure of the fluid is large, the boundary (dotted lines in FIGS. 4 to 6) between the separated region and the unseparated region is zigzagged. Such zigzagging greatly depends on the variation in pressure of the fluid. The characteristic feature of the variation in pressure changes every time the separation processing is executed. This means that the zigzagging path changes for each bonded substrate stack to be separated to impede improvement of the reproducibility of separation processing. Because of this poor reproducibility, the time required for separation processing changes for each bonded substrate stack. If such zigzagging becomes conspicuous, the separation force by the fluid that acts inside the bonded substrate stack may exceed an appropriate value. In this case, the bonded substrate stack 50 may be separated at a portion other than the separation layer to cause a defect in the separated substrate.

Figure 2:
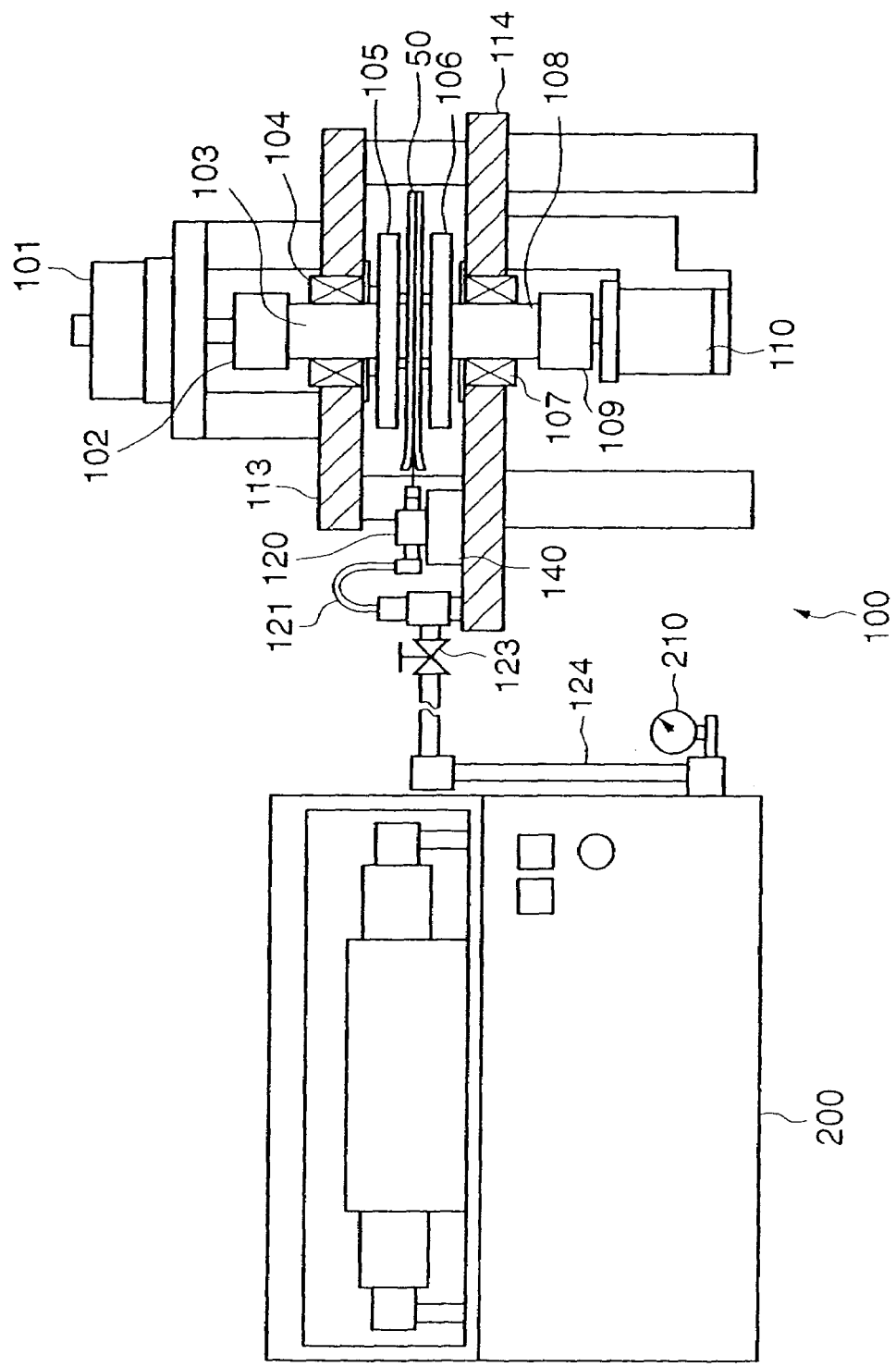
FIG. 2 is a view showing the arrangement of a separating apparatus according to a preferred embodiment of the present invention.

A separating method and apparatus improved on the basis of the above examination will be described below. FIG. 2 is a view showing the arrangement of the separating apparatus according to a preferred embodiment of the present invention. A separating apparatus 100 horizontally holds a bonded substrate stack 50 as a sample or composite member to be separated and injects a fluid (e.g., water) toward the porous layer of the bonded substrate stack 50 while rotating the bonded substrate stack 50, thereby separating the bonded substrate stack 50 into two substrates at the porous layer.

The bonded substrate stack 50 is held by a pair of substrate holding portions 105 and 106 which have a common central axis. The bonded substrate stack 50 may be held by a chuck mechanism provided in the pair of substrate holding portions 105 and 106 or by the pair of substrate holding portions 105 and 106.

The upper substrate holding portion 105 is connected to a motor 101 through a rotating shaft 103 and coupling 102. The rotational speed of the motor 101 is arbitrarily controlled by a controller (not shown). The rotating shaft 103 is axially supported by an upper table 113 through a bearing 104.

The lower substrate holding portion 106 is connected to an air cylinder 110 through a rotating shaft 108 and coupling 109. Hence, the lower substrate holding portion 106 is vertically moved by the air cylinder 110. The air cylinder 110 is driven to set the bonded substrate stack 50 in the separating apparatus 100 and detach the separated substrates from the separating apparatus 100. The air cylinder 110 can also be driven to apply a press force or tensile force (when the bonded substrate stack is chucked) to the bonded substrate stack 50 as needed during the separation processing. The air cylinder 110 is controlled by a controller (not shown). The rotating shaft 108 is axially supported by a lower table 114 through a bearing 107.

A nozzle 120 for injecting a fluid is arranged on the lower table 114. The position of the nozzle 120 is adjusted in a direction (vertical direction) parallel to the axial direction of the bonded substrate stack 50 and/or in a direction (horizontal direction) parallel to the planar direction of the bonded substrate stack 50. The nozzle 120 is directed to the porous layer (concave portion) of the bonded substrate stack 50 by the position adjusting mechanism 140.

The nozzle 120 is connected to the outlet of a servo-driven pump 200 through a high-pressure hose 121, valve 123, and high-pressure pipe 124. The servo-driven pump 200 has a pressure gauge 210 for detecting the pressure of the fluid at the outlet. On the basis of the output from the pressure gauge 210, the variation in pressure of the fluid is suppressed within a predetermined value (e.g., 10% of the target pressure).

Figure 3:
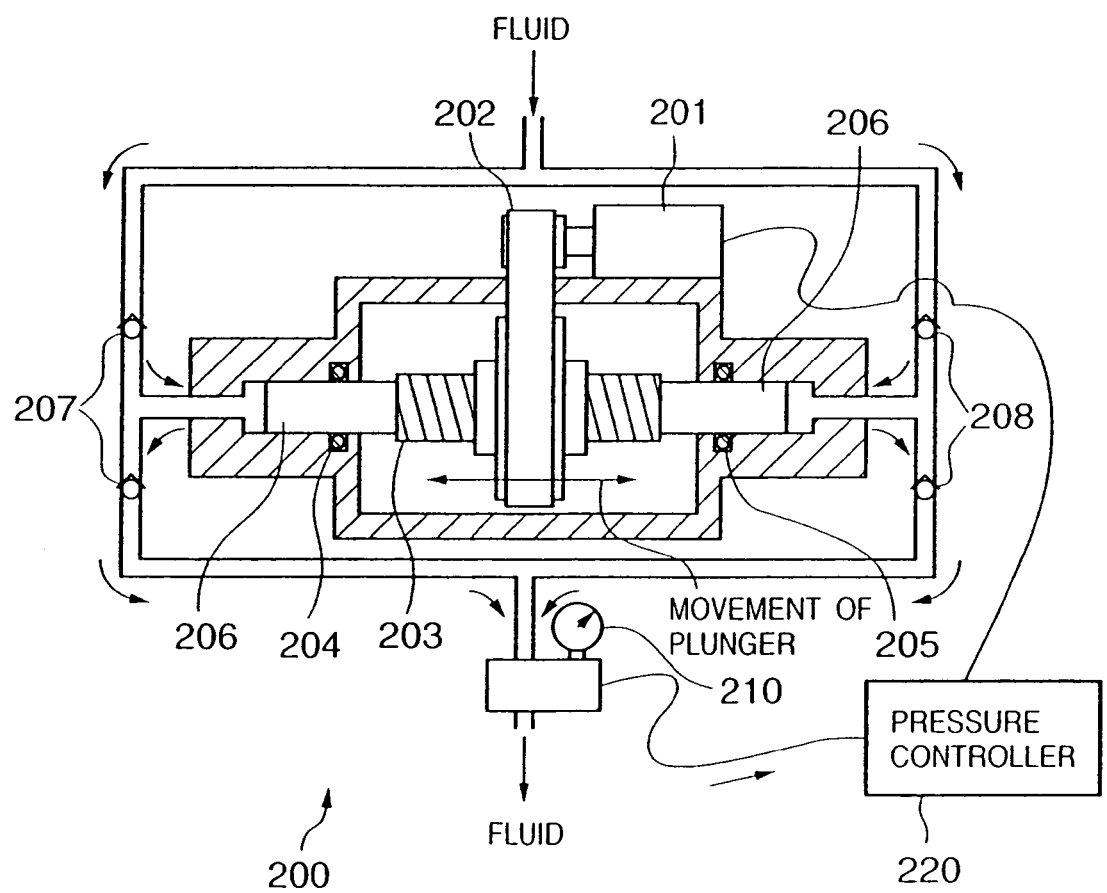
FIG. 3 is a view showing the schematic arrangement of a servo-driven pump.

FIG. 3 is a view showing the schematic arrangement of the servo-driven pump 200. Referring to FIG. 3, reference numeral 201 denotes a servo motor; 202, a timing belt; 203, a ball screw; 204 and 205, O-rings; 206, a plunger; 207, a check valve; 210, a pressure gauge; and 220, a pressure controller. The pressure controller 220 drives the servo motor 201 on the basis of the output from the pressure gauge 210 provided at the outlet such that the variation in pressure of the fluid at the outlet (the pressure of the fluid to be supplied to the nozzle 120) is suppressed within a predetermined value. The servo motor 201 drives the plunger 206 through the timing belt 202 and ball screw 203, thereby applying a pressure to the fluid.

A separating method using the separating apparatus 100 will be described next.

First, the air cylinder 110 is actuated to move the lower substrate holding portion 106 downward, and the bonded substrate stack 50 is transferred to a predetermined position between the pair of substrate holding portions 105 and 106 by a transfer robot or the like. The air cylinder 110 is actuated to move the lower substrate holding portion 106 upward and cause the pair of substrate holding portions 105 and 106 to hold the bonded substrate stack 50. If the pair of substrate holding portions 105 and 106 have a chuck mechanism, it may be actuated to chuck the bonded substrate stack 50. In addition, a press force or tensile force may be applied to the bonded substrate stack 50 by the air cylinder 110. The bonded substrate stack 50 may be held by applying a press force to the bonded substrate stack 50 by the air cylinder 110 without chucking the bonded substrate stack 50.

The position of the nozzle 120 is adjusted by the position adjusting mechanism 140 as needed such that the nozzle 120 is directed to the porous layer of the bonded substrate stack 50. The bonded substrate stack 50 preferably has a concave portion on the peripheral side of the porous layer. Normally, when substrates having beveling portions are used as the first and second substrates, and the first and second substrates are bonded, a concave portion is formed by the beveling portions of the substrates.

Before and after or simultaneously with the above operation, a preparation is done to inject a fluid from the nozzle 120. More specifically, the servo-driven pump 200 is actuated, and the operation waits until the pressure of the fluid (e.g., water) stabilizes within a predetermined range (e.g., within ±10% of the target pressure) of the target pressure (e.g., 500 kgf/cm$^2$). The pressure of the fluid is increased by driving the servo motor 201 to reciprocally move the plunger 206.

When the bonded substrate stack 50 is held by the pair of substrate holding portions 105 and 106, and the pressure of the fluid stabilizes, the valve 123 is opened to inject the fluid from the nozzle 120. The pressure of the fluid is maintained within a predetermined range (e.g., within ±10%) of the target pressure under the control of the pressure controller 220.

Before and after or simultaneously with the above operation, the motor 101 is actuated to rotate the bonded substrate stack 50. In this state, the operation waits until the bonded substrate stack 50 is separated into two substrates at the porous layer.

When separation of the bonded substrate stack 50 is ended, the valve 123 is closed, and the motor 101 is stopped. Additionally, the servo-driven pump 200 is stopped as needed (for example, when no more bonded substrate stacks to be separated remain).

Next, the air cylinder 110 is actuated to move the lower substrate holding portion 106 downward. The two separated substrates are received from the substrate holding portions 105 and 106 by the transfer robot or the like.

Figure 7:
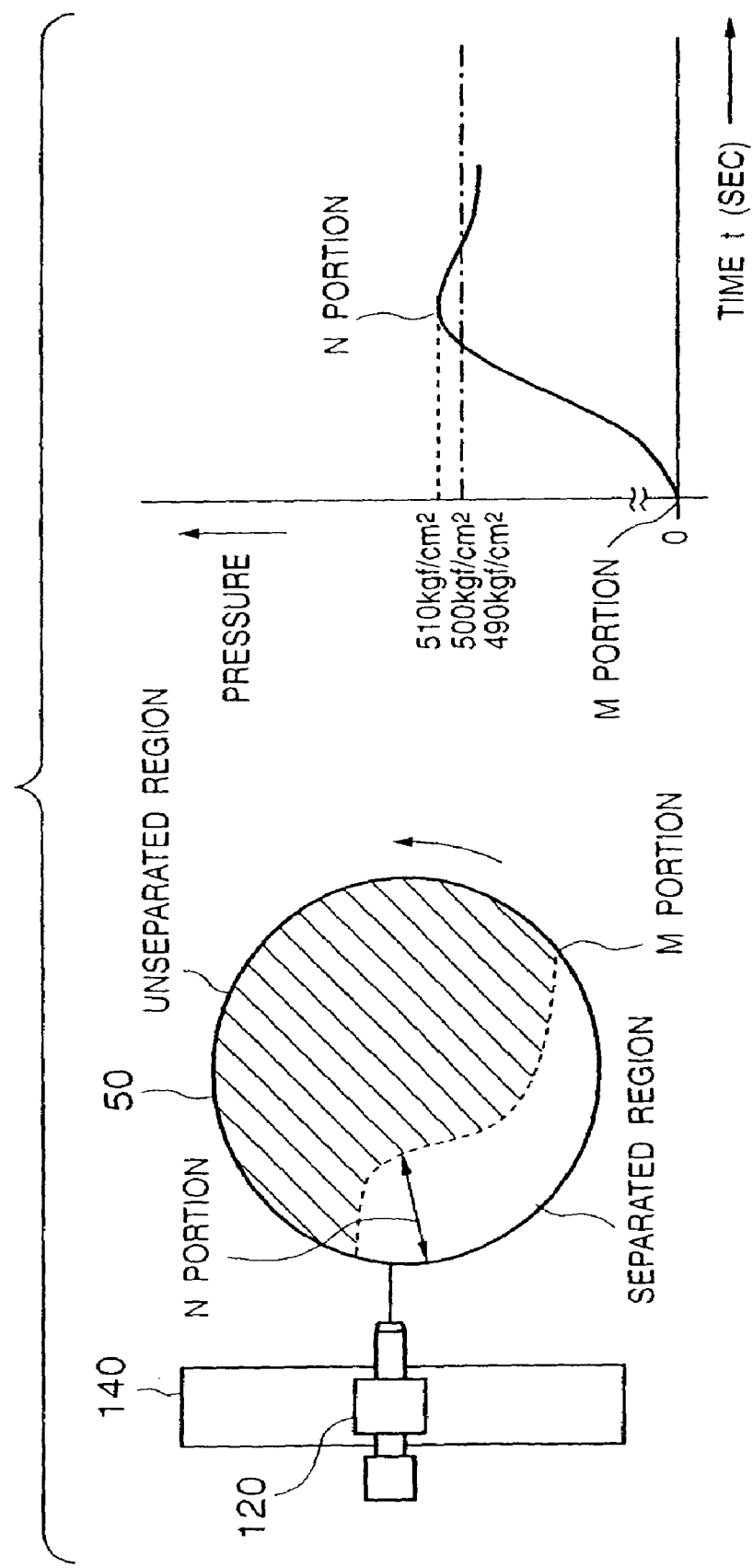
FIG. 7 shows a plan view and graph showing a state (initial stage) wherein the bonded substrate stack is separated while suppressing a variation in pressure of the fluid within a predetermined range in accordance with a preferred embodiment of the present invention.
Figure 8:
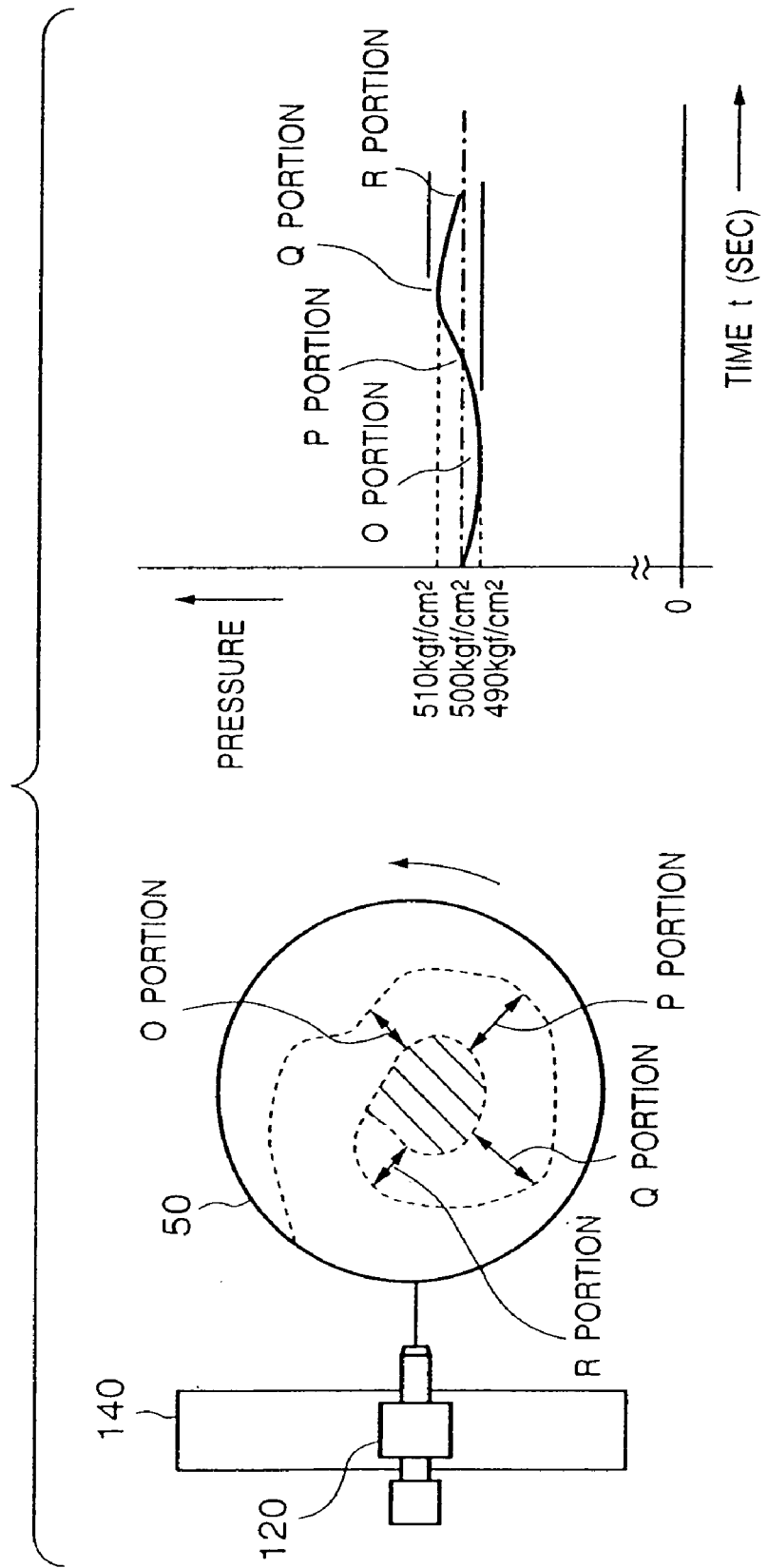
FIG. 8 shows a plan view and graph showing a state (intermediate stage) wherein the bonded substrate stack is separated while suppressing the variation in pressure of the fluid within the predetermined range in accordance with a preferred embodiment of the present invention.
Figure 9:
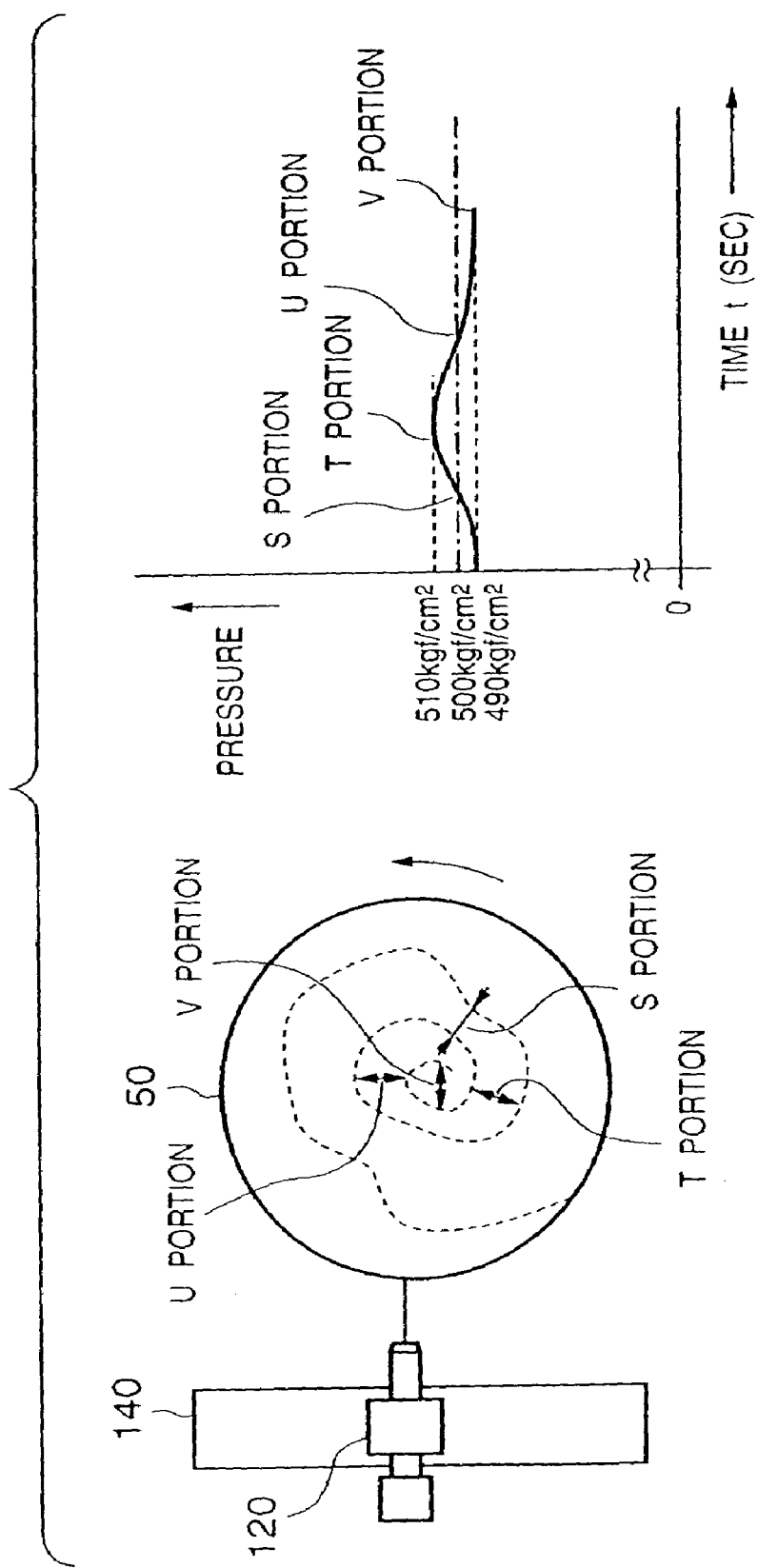
FIG. 9 shows a plan view and graph showing a state (final stage) wherein the bonded substrate stack is separated while suppressing the variation in pressure of the fluid within the predetermined range in accordance with a preferred embodiment of the present invention.

FIGS. 7 to 9 show a state wherein the bonded substrate stack is separated while suppressing the variation in pressure of the fluid within a predetermined range using the separating apparatus shown in FIG. 2. FIG. 7 schematically shows the initial stage of separation processing. FIG. 8 schematically shows the intermediate stage of separation processing. FIG. 9 schematically shows the final stage of separation processing. Referring to FIGS. 7 to 9, a "separated region" is an already separated region, an "unseparated region" is a region that has not been separated yet, and a "pressure" is the pressure of a fluid (et pressure). In this example, the variation in pressure of the fluid falls within the range of ±2% of the target pressure. When the variation in pressure of the fluid is small, the zigzagging at the boundary between the separated region and the unseparated region can be suppressed small. This contributes to improve the reproducibility of separation processing and prevent any defect by separation processing.

In the above separating method, the relative positional relationship between the nozzle 120 and the bonded substrate stack 50 is fixed, and in this state, the bonded substrate stack 50 is rotated and separated. In a separating method according to another embodiment of the present invention, at the initial stage of separation processing, the nozzle 120 is directed to a direction deviated from the center of the bonded substrate stack 50 (the peripheral portion of the bonded substrate stack 50), and the fluid whose variation in pressure is suppressed within a predetermined range is injected to the porous layer of the bonded substrate stack 50. After that, the bonded substrate stack 50 is separated at the porous layer while changing the position of the nozzle 120 gradually or stepwise such that it is directed to the central portion of the bonded substrate stack. In the separating method according to another embodiment of the present invention, the bonded substrate stack is separated by the fluid whose variation in pressure is suppressed within a predetermined range while changing the fluid injection position for the bonded substrate stack 50 gradually or stepwise from the peripheral portion to the central portion of the bonded substrate stack 50.

This separating method can be implemented by using the separating apparatus 100 shown in FIG. 2. More specifically, the position of the nozzle 120 is moved by the position adjusting mechanism 140 in separation processing.

Figure 10:
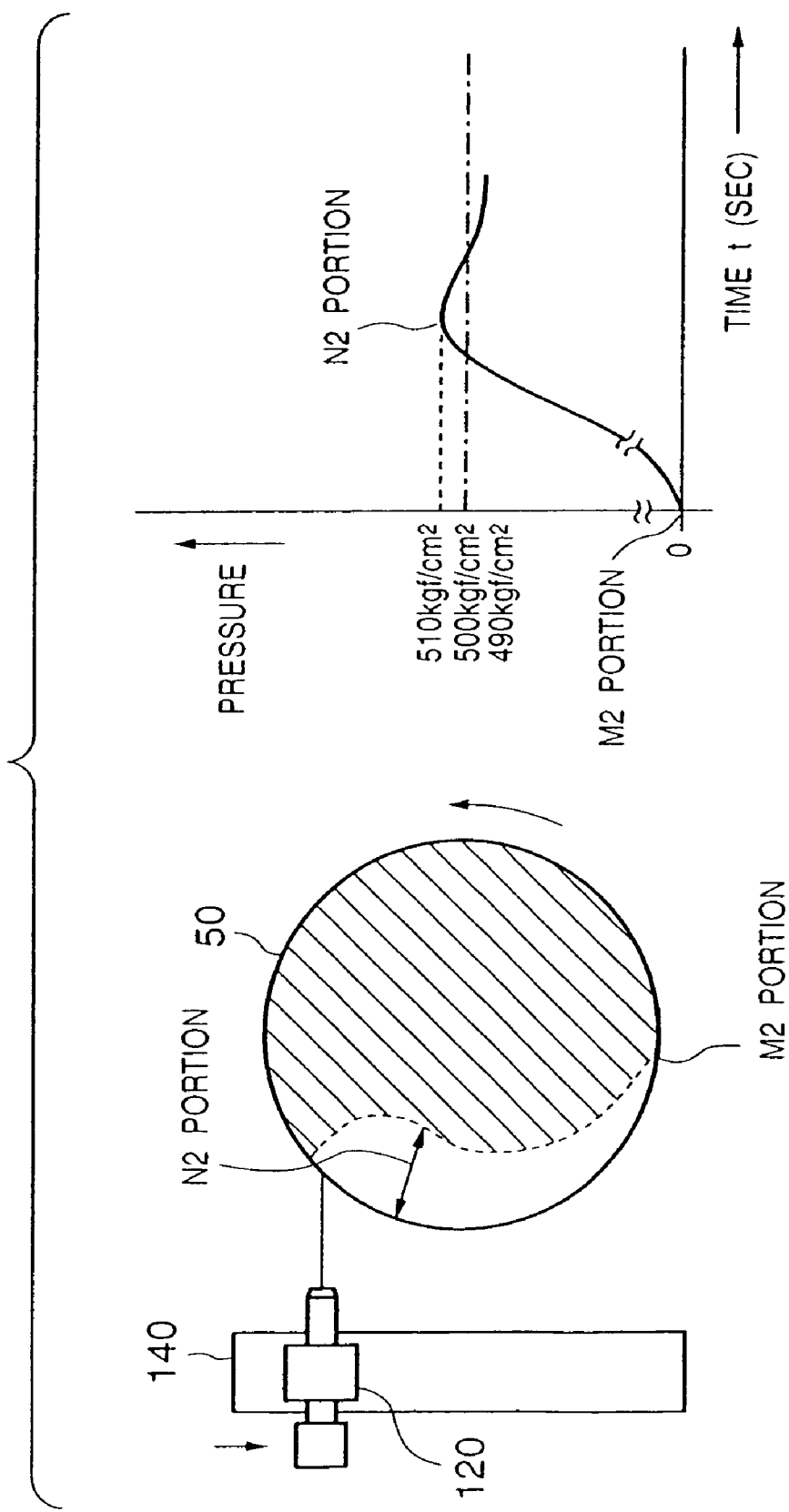
FIG. 10 shows a plan view and graph showing a state (initial stage) wherein the bonded substrate stack is separated while controlling the nozzle position and suppressing a variation in pressure of the fluid within a predetermined range in accordance with another preferred embodiment of the present invention.
Figure 11:
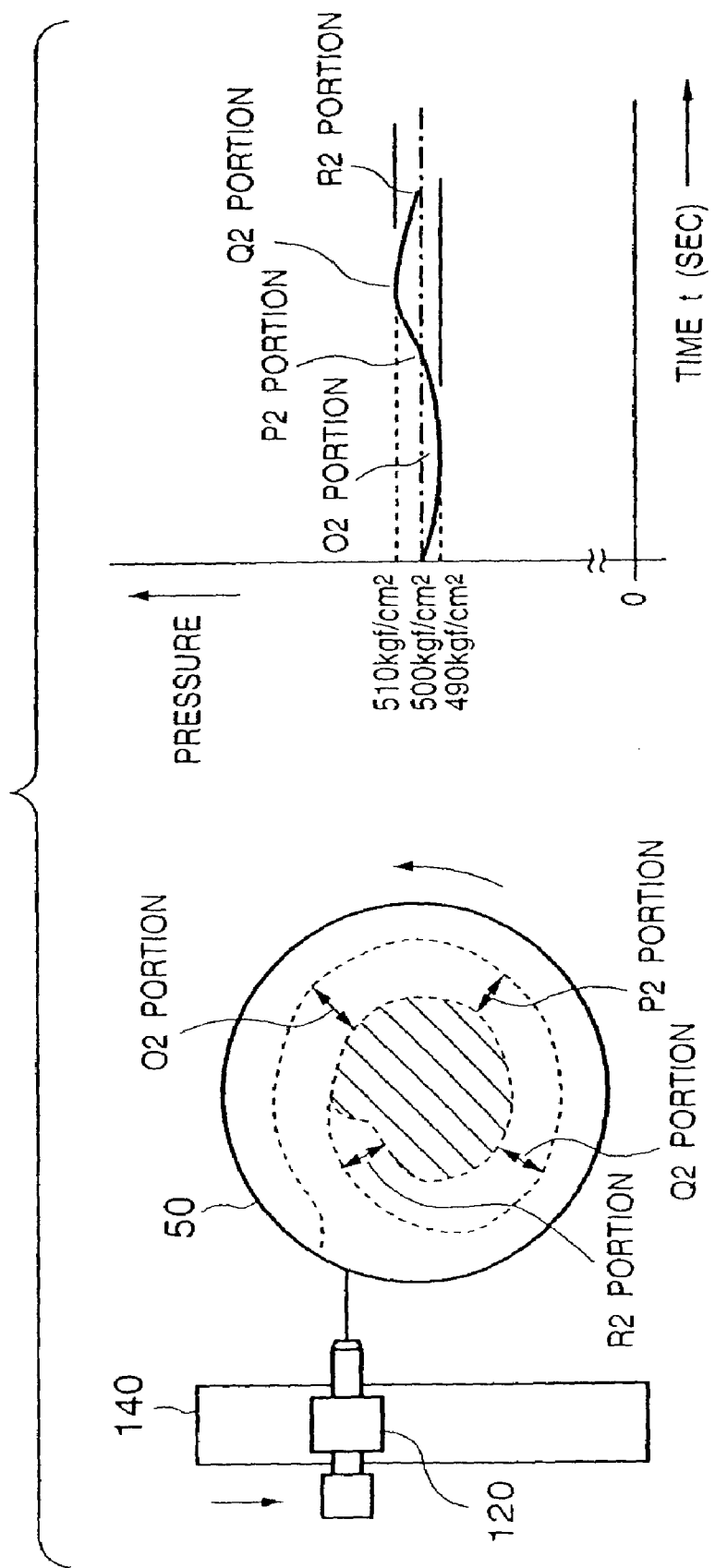
FIG. 11 shows a plan view and graph showing a state (intermediate stage) wherein the bonded substrate stack is separated while controlling the nozzle position and suppressing the variation in pressure of the fluid within the predetermined range in accordance with another preferred embodiment of the present invention.
Figure 12:
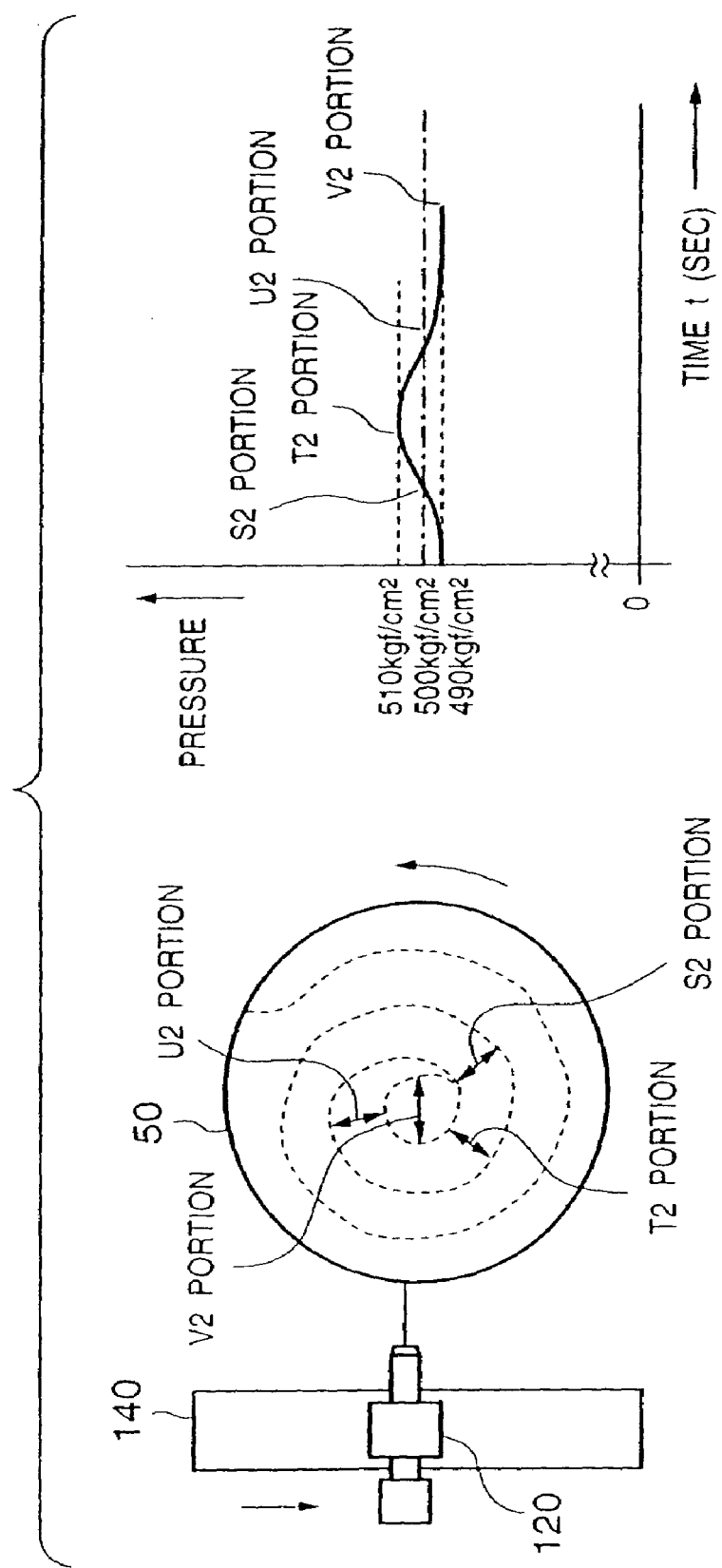
FIG. 12 shows a plan view and graph showing a state (final stage) wherein the bonded substrate stack is separated while controlling the nozzle position and suppressing the variation in pressure of the fluid within the predetermined range in accordance with another preferred embodiment of the present invention.

FIGS. 10 to 12 show a state wherein the bonded substrate stack is separated by the separating method according to another embodiment of the present invention. FIG. 10 schematically shows the initial stage of separation processing. FIG. 11 schematically shows the intermediate stage of separation processing. FIG. 12 schematically shows the final stage of separation processing. Referring to FIGS. 10 to 12, a "separated region" is an already separated region, an "unseparated region" is a region that has not been separated yet, and a "pressure" is the pressure of a fluid (et pressure). In this example, the variation in pressure of the fluid falls within the range of ±2% of the target pressure.

When the variation in pressure of the fluid is made small, the zigzagging at the boundary (dotted lines in FIGS. 10 to 12) between the separated region and the unseparated region can be suppressed small. This contributes to improve the reproducibility of separation processing and prevent any defect by separation processing.

When the fluid injection position for the bonded substrate stack 50 is changed gradually or stepwise from the peripheral portion to the center of the bonded substrate stack 50 in separation processing, the zigzagging at the boundary (dotted lines in FIGS. 10 to 12) between the separated region and the unseparated region can be made smaller. This is because when the fluid injection position for the bonded substrate stack 50 is changed along with the progress of separation processing, any unexpected portion can be prevented from being separated.

EXAMPLE OF SEMICONDUCTOR DEVICE

A semiconductor device using a semiconductor substrate that can be manufactured by the above substrate manufacturing method (FIGS. 1A to 1E) and a method of manufacturing the device will be described next with reference to FIGS. 13A to 13D.

FIGS. 13A to 13D are sectional views showing a method of manufacturing a semiconductor device using a semiconductor substrate that can be manufactured using the substrate manufacturing method according to the preferred embodiment of the present invention.

First, an SOI substrate having a semiconductor layer as a non-porous layer 13 and an insulating layer as a non-porous layer 14 is manufactured using the above substrate manufacturing method. An active region 13' where a transistor is to be formed and an element isolation region 54 are formed by a method of patterning the non-porous semiconductor layer (SOI layer) 13 on the buried insulating layer 14 into an island shape or an oxidation method called LOCOS (FIG. 13A).

Figure 13A:
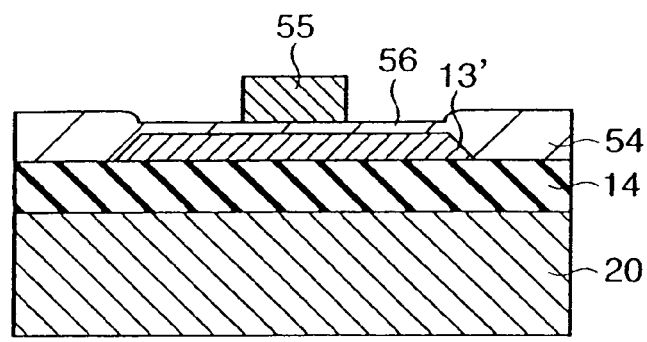
FIGS. 13A to 13D are sectional views showing a method of manufacturing a semiconductor device using a semiconductor substrate manufactured using the substrate manufacturing method according to the preferred embodiment of the present invention.

Next, a gate insulating film 56 is formed on the surface of the SOI layer (FIG. 13A). Examples of the material of the gate insulating film 56 are silicon oxide, silicon nitride, silicon oxynitride, aluminum oxide, tantalum oxide, hafnium oxide, titanium oxide, scandium oxide, yttrium oxide, gadolinium oxide, lanthanum oxide, zirconium oxide, and a glass mixture thereof. The gate insulating film 56 can be formed by, e.g., oxidizing the surface of the SOI layer or depositing an appropriate substance on the surface of the SOI layer by CVD or PVD.

A gate electrode 55 is formed on the gate insulating film 56 (FIG. 13A). The gate electrode 55 can be formed from, e.g., polysilicon doped with a p- or n-type impurity, a metal such as tungsten, molybdenum, titanium, tantalum, aluminum, or copper or an alloy containing at least one of them, a metal silicide such as molybdenum silicide, tungsten silicide, or cobalt silicide, or a metal nitride such as titanium nitride, tungsten nitride, or tantalum nitride. The gate insulating film 56 may be formed by stacking a plurality of layers formed from different materials. The gate electrode 55 can be formed either by, e.g., a method called Salicide (self-align silicide) or by a method called a damascene gate process, or by any other method. With the above process, a structure shown in FIG. 13A is obtained.

Figure 13B:
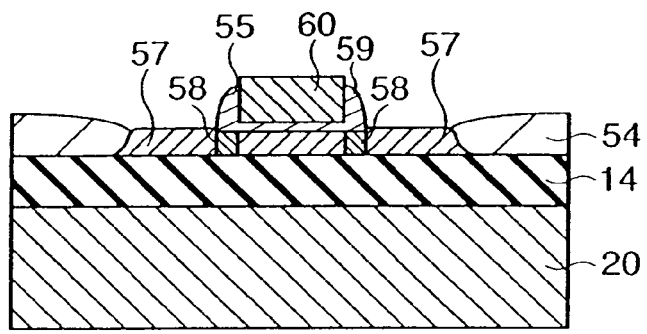

Next, an n-type impurity such as phosphor, arsenic, or antimony or a p-type impurity such as boron is doped into the active region 13', thereby forming relatively lightly-doped source and drain regions 58 (FIG. 13B). The impurity can be doped by, e.g., ion implantation and annealing.

An insulating film is formed to cover the gate electrode 55 and then etched back, thereby forming a side wall 59 on the side surface of the gate electrode 55.

An impurity having the same conductivity type as described above is doped into the active region 13' again, thereby forming relatively heavily-doped source and drain regions 57. With the above process, a structure shown in FIG. 13B is obtained.

Figure 13C:
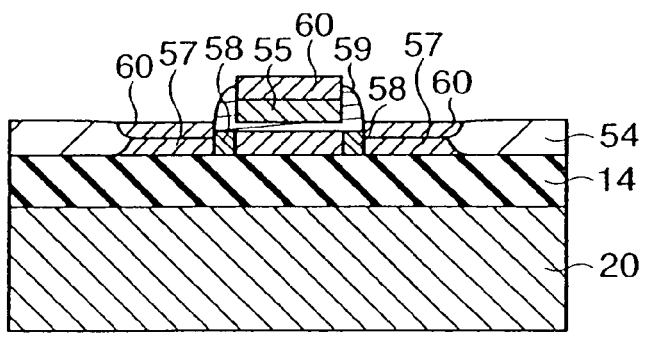

A metal silicide layer 60 is formed on the upper surface of the gate electrode 55 and on the upper surfaces of the source and drain regions 57. Examples of the material of the metal silicide layer 60 are nickel silicide, titanium silicide, cobalt silicide, molybdenum silicide, and tungsten silicide. Such a silicide can be formed by depositing a metal on the upper surface of the gate electrode 55 and on the upper surfaces of the source and drain regions 57, performing annealing to cause the metal to react with underlying silicon, and removing an unreacted portion of the metal using an etchant such as sulfuric acid. The surface of the silicide layer may be nitrided as needed. With the above process, a structure shown in FIG. 13C is obtained.

Figure 13D:
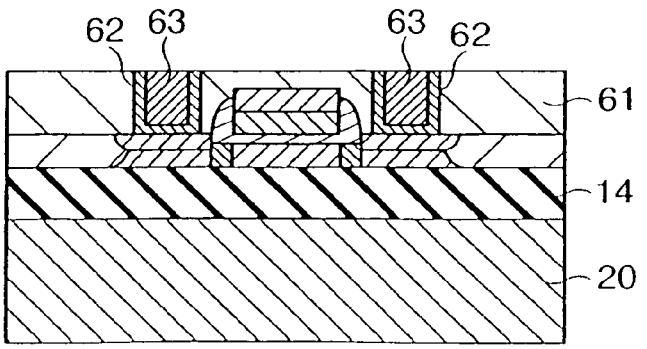

An insulating film 61 is formed on the upper surface of the gate electrode and on the upper surfaces of the source and drain regions, which are converted into a silicide (FIG. 13D). As the material of the insulating film 61, silicon oxide containing phosphor and/or boron can be used.

Contact holes are formed in the insulating film 61 by CMP, as needed. When photolithography using a KrF excimer laser, ArF excimer laser, $F_2$ excimer laser, electron beam, or X-rays is used, a rectangular contact hole with a side smaller than 0.25 μm or a circular contact hole having a diameter smaller than 0.25 μm can be formed.

Next, the contact holes are filled with a conductor. To fill the contact holes with a conductor, a film of a refractory metal or a nitride thereof, which serves as a barrier metal, is formed on the inner surface of each contact hole, and after that, a conductor 63 such as a tungsten alloy, aluminum, aluminum alloy, copper, or copper alloy is deposited by CVD, PVD, or plating. A conductor may be deposited to a level higher than the upper surface of the insulating film 61 and removed by etch back or CMP. Alternatively, before the contact holes are filled with the conductor, the surface of the silicide layer in the source and drain regions, which is exposed to the bottom portion of each contact hole, may be nitrided. With the above process, a transistor such as an FET can be formed on the SOI layer, and a semiconductor device having a transistor with a structure shown in FIG. 13D can be obtained.

When the thickness and impurity concentration of the active layer (SOI layer) 13' are defined such that a depletion layer formed upon applying a voltage to the gate electrode reaches the upper surface of the buried insulating layer 14, the formed transistor operates a complete depletion type transistor. When the thickness and impurity concentration of the active layer (SOI layer) 13' are defined such that the depletion layer does not reach the upper surface of the buried insulating layer 14, the formed transistor operates a partial depletion type transistor.

According to the present invention, the reproducibility and yield in separating a sample or composite member such as a bonded substrate stack are improved.

As many apparently widely different embodiments of the present invention can be made without departing from the spirit and scope thereof, it is to be understood that the invention is not limited to the specific embodiments thereof except as defined in the appended claims.

What is claimed is:

1. A separating method of separating a sample by a fluid, wherein a sample having a fragile separation layer inside is separated at the separation layer while injecting a fluid whose variation in pressure is suppressed within a predetermined range to the separation layer of the sample.

2. The method according to claim 1, wherein the predetermined range is ±10% of a target pressure.

3. The method according to claim 1, wherein the pressure of the fluid is servo-controlled.

4. The method according to claim 1, wherein the sample is separated while being rotated about an axis perpendicular to the separation layer.

5. The method according to claim 1, wherein the sample is separated while changing a position where the fluid is injected to the sample along with progress of separation processing.

6. The method according to claim 1, wherein the sample is separated while changing the position where the fluid is injected to the separation layer of the sample gradually or stepwise from a peripheral portion to a central portion of the separation layer along with progress of the separation processing.

7. The method according to claim 1, wherein the sample has, outside the separation layer, a concave portion recessed from a side surface.

8. The method according to claim 1, wherein the separation layer is a layer formed by anodization.

9. The method according to claim 1, wherein the separation layer is a layer formed by ion implantation.

10. A transfer method of transferring a transfer layer on a surface of a first member to a second member, comprising:
   the preparation step of preparing a composite member by bringing the first member having a separation layer inside and the transfer layer on the separation layer into tight contact with the second member; and
   the step of separating the composite member at the separation layer while injecting a fluid, maintained at substantially constant pressure by suppressing variation in the pressure within a predetermined range, to the separation layer of the composite member, thereby transferring the transfer layer of the first member to the second member.

11. A substrate manufacturing method comprising:
   the preparation step of preparing a bonded substrate stack by bonding a first substrate having a separation layer inside and a transfer layer on the separation layer to a second substrate; and
   the separation step of separating the bonded substrate stack at the separation layer while injecting a fluid, maintained at substantially constant pressure by suppressing variation in the pressure within a predetermined range, to the separation layer of the bonded substrate stack.

12. The method according to claim 11, wherein the predetermined range is ±10% of a target pressure.

13. The method according to claim 11, wherein in the separation step, the pressure of the fluid is servo-controlled.

14. The method according to claim 11, wherein in the separation step, the bonded substrate stack is separated while being rotated about an axis perpendicular to the separation layer.

15. The method according to claim 11, wherein in the separation step, the bonded substrate stack is separated while changing a position where the fluid is injected to the bonded substrate stack along with progress of separation processing.

16. The method according to claim 11, wherein in the separation step, the bonded substrate stack is separated while changing the position where the fluid is injected to the separation layer of the bonded substrate stack gradually or stepwise from a peripheral portion to a central portion of the separation layer along with progress of the separation processing.

17. The method according to claim 11, wherein the separation layer is a fragile layer.

18. The method according to claim 11, wherein the separation layer is a layer formed by anodization.

19. The method according to claim 11, wherein the separation layer is a layer formed by ion implantation.

20. The method according to claim 11, wherein the transfer layer includes a single-crystal Si layer.

21. The method according to claim 20, wherein the transfer layer has, in addition to the single-crystal Si layer, an insulating layer on the single-crystal Si layer.

22. A semiconductor device manufacturing method comprising:

the step of preparing an SOI substrate using the substrate manufacturing method of claim 11; and the step of element-isolating an SOI layer of the SOI substrate and forming a transistor on the element-isolated SOI layer.

23. The method according to claim 22, wherein the transistor is a partial depletion type FET.

24. The method according to claim 22, wherein the transistor is a complete depletion type FET.

* * * * *

UNITED STATES PATENT AND TRADEMARK OFFICE
CERTIFICATE OF CORRECTION

| | |
|---|---|
| PATENT NO. | : 7,017,830 B2 |
| APPLICATION NO. | : 10/644032 |
| DATED | : March 28, 2006 |
| INVENTOR(S) | : Kazutaka Yanagita et al. |

It is certified that error appears in the above-identified patent and that said Letters Patent is hereby corrected as shown below:

<u>ON TITLE PAGE, ITEM (56) OTHER PUBLICATIONS</u>

Insert: --Office Action dated November 24, 2003 of corresponding Korean Patent Application No. 10-2001-0050925.--.

<u>COLUMN 12</u>

Line 12, "(et" should read --(jet--.

Signed and Sealed this

Twenty-seventh Day of March, 2007

JON W. DUDAS
*Director of the United States Patent and Trademark Office*